(12) United States Patent
Cabrera (10) Patent No.: US 8,715,468 B2
(45) Date of Patent: May 6, 2014

(54) MACHINE AND METHOD FOR MACHINING A PART BY MICRO-ELECTRICAL DISCHARGE MACHINING

(75) Inventor: Michel Cabrera, Lyons (FR)

(73) Assignees: Universite de Lyon I Claude Bernard, Villeurbanne (FR); Centre National de la Recherche, Paris (FR); Ecole Centrale de Lyon, Ecully (FR)

( * ) Notice: Subject to any disclaimer, the term of this patent is extended or adjusted under 35 U.S.C. 154(b) by 629 days.

(21) Appl. No.: 13/119,490

(22) PCT Filed: Sep. 9, 2009

(86) PCT No.: PCT/EP2009/061683
§ 371 (c)(1),
(2), (4) Date: Mar. 17, 2011

(87) PCT Pub. No.: WO2010/031716
PCT Pub. Date: Mar. 25, 2010

(65) Prior Publication Data
US 2011/0174634 A1    Jul. 21, 2011

(30) Foreign Application Priority Data

Sep. 19, 2008 (FR) ...................................... 08 05148

(51) Int. Cl.
*C25F 7/00* (2006.01)
*C25F 3/02* (2006.01)
*B23H 1/04* (2006.01)
*B23H 9/08* (2006.01)

(52) U.S. Cl.
USPC ..... 204/228.7; 205/645; 205/664; 219/69.11; 219/69.15; 204/224 M (58) Field of Classification Search
CPC ............... C25F 7/00; C25F 3/02; B23H 1/04; B23H 9/08
USPC .................. 204/224 M, 228.7; 205/645, 664; 219/69.11, 69.15
See application file for complete search history.

(56) References Cited

U.S. PATENT DOCUMENTS

| 5,145,564 A | 9/1992 | Lemke et al. |
| 2002/0170829 A1 | 11/2002 | Kim et al. |
| 2004/0168288 A1 | 9/2004 | Rahman et al. |

FOREIGN PATENT DOCUMENTS

| JP | 58 015630 | 1/1983 |
| JP | 2002 254246 | 9/2002 |
| WO | WO 2006/110489 | 10/2006 |

OTHER PUBLICATIONS

Vallance et al. "Micro-tool Characterization Using Scanning White Light Interferometry" *J. Micromech. Microeng.* 14: 1234-1243 (2004).

Feng-Tsai Weng "Fabrication of Microelectrodes for EDM Machining by a Combined Etching Process" *J Micromech. Microeng.* 14: pp. N1-N4 (2004).

(Continued)

*Primary Examiner* — Nicholas A Smith
(74) *Attorney, Agent, or Firm* — Occhiuti & Rohlicek LLP (57) ABSTRACT

The invention relates to a machine for machining a part by micro-electrical discharge machining, said machine comprising a mechanism (44, 45, 46, 48) for modifying the configuration of the machine so as to alternatively and reversibly switch from a machining configuration to a sharpening configuration in which the tip of a same etching electrode (20) and another electrode (64) are dipped in an electrolyte bath in order to sharpen the tip of the etching electrode by electrochemnical corrosion.

10 Claims, 3 Drawing Sheets

(56) References Cited

OTHER PUBLICATIONS

Benilov et al. "Micro and Nano Electrical Discharge Machining in Microfluidics and Micro Nanotechnology" *11th ESAFORM 2008 Conference on Material Forming*, Lyon, France, Apr. 23-25, 2008; also published in: *International Journal of Material Forming*, 1(1): 1315-1318 (2008).

Rajurkar et al. "Micro and Nano Machining by Electro-Physical and Chemical Processes" *Annals of the CIRP*, 55(2): 643-666 (2006).

Lim et al. "Development and Evaluation of an On-Machine Optical Measurement Device" *International Journal of Machine Tools & Manufacture* 47: 1556-1562 (2007).

Lim et al. "Fabrication of Arbitrarily Shaped Microelectrodes by Electrochemical Etching" *Jpn. J. Appl. Phys.*, 42: 1479-1485 (2003).

Lim et al, "An Electrochemical Fabrication Method for Extremely Thin Cylindrical Micropin" *International Journal of Machine Tools & Manufacture*, 41: 2287-2296 (2001).

Choi et al. "Fabrication of WC Micro-shaft by Using Electrochemical Etching" *Int. J. Adv. Manuf. Technol.*, 31: 682-687 (2007).

Arthur Benilov "Electrical Discharge Machining of Silicon" *l'Ecole Centrale de Lyon*, ch. 8: p. 1-49 (2007).

MACHINE AND METHOD FOR MACHINING A PART BY MICRO-ELECTRICAL DISCHARGE MACHINING

CROSS REFERENCE TO RELATED APPLICATIONS

This application is the national stage entry under 35 USC 371 for: PCT/EP2009/061683, filed on Sep. 9, 2009, which claims the benefit of the Sep. 19, 2008 priority date of French application FR0805148. The contents of both the foregoing applications are incorporated herein by reference.

FIELD OF THE INVENTION

The invention pertains to a machine and a method for machining a part by micro-electrical discharge machining.

BACKGROUND OF THE INVENTION

Electrical discharge machining is generally also known by the acronym EDM. Its miniaturization (micro-EDM or µEDM) has different variants depending on the shape of the etching electrode (which here below will also be called here a micro-electrode). These variants are the following:
- Die-sinking micro-electrical discharge machining in which a microelectrode with a shape complementary to the shape to be machined is sunken into the part.
- Wire micro-electrical discharge machining with a conductive wire circulating or driven by an alternating motion.
- The drilling of holes by micro-electrical discharge machining with a tip electrode or a tube electrode.
- Milling micro-electrical discharge machining better known as milling EDM.

Milling micro-electrical discharge machining does not necessarily imply a rotational motion of the microelectrode or machined part.

Here below in this description, whenever "micro-electrical discharge machining" is mentioned, reference is being made to a technology corresponding to milling micro-electrical discharge machining.

The present filing party knows machines for machining a part by micro-electrical discharge machining having a machining configuration in which a tip of an etching electrode is plunged into a bath of (insulating) dielectric fluid bathing one face to be machined of the part in order to carry out a machining of this part by micro-electrical discharge machining. This tip is small enough to enable the etching of grooves in the face whose cross-width is greater than 10 µm.

For machining complex shapes, the electrode describes a three-dimensional path in gradually removing material from the part, as would be done by a micro-mill in a chip-removal method. The difference is that the elementary action of removing material is not a mechanical action but a thermal action produced by an electrical arc. The cutting action is swift. The cooling is obtained by the dielectric fluid bath filling the space crossed by the electrical arc between the etching electrode and the part to be machined. This space is called a "gap".

Micro-electrical discharge machining can be used to machine all conductive materials (steel, titanium etc) and semi-conductive materials (silicone, silicone carbide etc). It enables especially the machining of hard metals which cannot be machined by classic methods. Indeed, there is no mechanical contact between the electrode and the part to be machined.

Micro-electrical discharge machining can be distinguished from prior-art electrochemical corrosion methods known as electrochemical machining (ECM) by the need to create a major difference in potential between the etching electrode and the part to be machined. To create this difference in potential, the dielectric fluid has to fill the gap. Conversely, electrochemical machining is based on an oxidation reaction prompted by a current flowing between the etching electrode and the part to be machined. In order that the current may be set up, the etching electrode and the part to be machined are plunged into an electrolyte bath, i.e. a bath of a conductive fluid. The electrochemical corrosion can be produced by a current which flows between the etching electrode and the part to be machined or by discharges of current between these two elements. During the machining of a part by electro-chemical corrosion, the wearing out of the electrode is often negligible. This is not the case in the electrical discharge machining method where it can happen that the wearing out of the electrode is not negligible.

In the case of milling by micro-electrical discharge machining, the electrode follows a machining path to machine the face of a part. The great value of this method is that the machining path may have several variations in height relatively to the face of the part to be machined or may even vary continuously. When this machining path has several variations in height relatively to the face of the part to be machined, it is said here that the machining is three-dimensional machining. Three-dimensional machining is done by making imprints, holes or non-through grooves the depths of which relatively to the face of the part vary in stages. This can be obtained directly from a digital definition obtained by computer-assisted design, thus preventing the manufacture of complex and costly toolings (which is the case for example with die sinking micro-electrical discharge machining). In general, high shape factors (ratio of the drilling depth to the drilling diameter) can be obtained by this method, giving typically shape factors of more than 10 or 100.

As shall be seen here below, the manufacture of electrodes limits the development of this method while potential applications are very great. Indeed, by principle, micro-electrical discharge milling makes it possible to envisage for example:
- the machining of toolings:
  - hard-steel molds for microplasturgy
  - master models for microstamping
  - metal imprints by hot embossing or micro-hot-embossing.
- machining of micro-parts:
  - micro-turbines made out of very hard materials,
  - micro-heat-exchangers,
  - medical parts made of titanium (for example microstents)
  - diesel injection nozzles etc.

Specifically, in the field of micro-nanotechnologies, milling micro-electrical machining is used to machine materials little used in this field (titanium, SiC, diamond etc) with very high resolution, and at low cost. Furthermore, it is very difficult by classic techniques of microtechnology (FIB, RIE etc) to machine semi-conductive materials with a high shape factor, the main technique used in this case being designated by the acronym LIGA (Lithografie Galvanoformung Abformung or Lithography Electroplating and Molding) which is very costly. It is even impossible with these techniques to carry out machining with a continuous variation in depth (the number of photolithography masks is always limited in microtechnology). Thus, even silicon machining could derive benefit from milling micro-electrical discharge machining provided that it is easy to use electrodes with sufficiently fine tips, i.e. with diameters of less than 10 µm.

Now, in the prior art, electrodes for milling by micro-electrical discharge machining are wires, tips or tubes with a diameter of over 20-40 µm. Indeed, these microelectrodes are made finer by mechanical machining (polishing for example) by reverse electrical discharge machining or again by wire micro-electrical discharge machining with a circulating wire electrode. Specifically, in the case of the piercing of holes by micro-electrical discharge machining, demonstrations of principle have been made with 5 μm electrodes but this principle has not been extended to the machining of complex shapes. Finally, in the case of wire micro-electrical discharge machining, the diameter of the wire is limited in practice to 20 μm because of problems of mechanical strength.

The etching electrodes used for carrying out micro-electrical discharge machining are very small. These electrodes get worn out during micro-electrical discharge machining. They therefore need to be frequently replaced. This replacement of electrodes is a complicated task because of the small size and brittleness of these electrodes. For example, this replacing of electrodes is done by hand after each machining operation. These difficult operations for replacing electrodes therefore limit the productivity of current machining toolings using micro-electrical discharge machining.

The present invention generally seeks to mitigate the defects of the prior art by proposing a machining tool with a resolution of less than 10 μm and increased productivity.

SUMMARY OF THE INVENTION

An object of the invention therefore is a machine for micro-electrical discharge machining in which the machine has a mechanism for modifying the configuration of the machine to make it pass alternately and reversibly from the machining configuration to a sharpening configuration in which the tip of the same etching electrode and another electrode are plunged into a electrolyte bath to carry out a sharpening of the tip of the etching electrode by electrochemical machining.

In the above machine, the electrode is replaced less frequently because it is re-sharpened without any need to dismount it from the micro-electrical discharge machining machine. This feature therefore limits operations for replacing the etching electrode, thus increasing the productivity of this machine.

Furthermore, sharpening by electrochemical machining gives tips with diameters ranging from 10 nm to 10 μm, typically 100 nm to 1 μm. Thus, machining with a resolution of less than 10 μm is possible.

The embodiments of this machine may comprise one or more of the following characteristics:
  the machine has a first recipient containing the dielectric fluid bath and a second recipient containing the electrolyte bath, and the mechanism is capable of transporting the etching electrode between the first and second recipients to pass from the machining configuration to the sharpening configuration and vice versa;
  the machine has a first recipient containing the dielectric fluid bath and a second recipient containing the electrolyte fluid bath and the mechanism is capable of shifting the first and second recipients relatively to the etching electrode to pass from the machining configuration to the sharpening configuration and vice versa;
  the machine has a same recipient containing baths of dielectric fluid and electrolyte at the same time, these baths having different mass densities and being non-miscible so that these baths can be superimposed, one above the other;
  the machine has an actuator capable, in the machining configuration, of shifting the etching electrode perpendicularly to the face to be machined of the part in order to adjust the width of a gap between the tip of this electrode and this face to be machined and the same actuator is capable, in the sharpening configuration, of shifting the etching electrode perpendicularly to the surface of the electrolyte bath; the machine comprises:
    a controllable actuator capable, in the machining configuration, of shifting the etching electrode perpendicularly to the face to be machined of the part to adjust the width of a gap between the tip of this electrode and this face to be machined,
    a sensor of the shape of this tip, and
    a control unit capable of:
      determining the wearing out of the tip from the measurements of the shape sensor, and
      controlling the actuator to adjust the width of the gap as a function of the determined wear.

These embodiments of the micro-electrical discharge machining tool furthermore have the following advantages:
  the use of a mechanism for conveying the etching electrode between a dielectric fluid bath and an electrolyte bath makes it possible to modify the configuration of the machine in a simple way,
  shifting the dielectric and electrolyte fluid baths relatively to the electrode, makes it possible also to modify the configuration of the machine in a simple way,
  using dielectric and electrolyte fluid baths superimposed on each other in a same recipient simplifies the mechanism for passing from the machining configuration to the sharpening configuration and vice versa,
  using the same actuator to adjust the width of the gap during the machining and to shift the electrode relatively to the surface of the electrolyte bath decreases the cost of making this machine,
  adjusting the width of the gap to the wear of the electrode tip improves the precision of three-dimensional machining.

An object of the invention is also a method for machining a part by micro-electrical discharge machining by means of a configurable machine for micro-electrical discharge machining. This method includes the actuation of a mechanism for modifying the configuration of a machine to pass alternately and reversibly between:
  a machining configuration in which a tip of an etching electrode is plunged into a bath of dielectric fluid that bathes a face to be machined in order to perform a machining of this part by electrical discharge machining, this tip being small enough to enable the etching of grooves in the face whose cross-width is less than 10 μm, and
  a sharpening configuration in which the tip of the same etching electrode and another electrode are plunged into an electrolyte bath to carry out a sharpening of the tip of the etching electrode by electrochemical machining.

The embodiments of this method may include one or more of the following characteristics:
  the method comprises:
    measuring the shape of the tip,
    determining the wear of the tip from these measurements, and
    activating the automatic passage from the machining configuration to the sharpening configuration as soon as the determined wear crosses a predetermined threshold;
  before passing to the machining configuration, the method comprises:
    measuring the shape of the tip
    comparing the measured shape with a predetermined template, and permitting the passage to the machining configuration if the shape is included in the predetermined template and, if not, inhibiting the passage to the machining configuration;

the method comprises:
measuring the shape of the tip,
determining the wear of the tip from measurements of its shape, and
adjusting the width of a gap between the tip and the face to be machined as a function of the determined wear.

The embodiments of this micro-electrical discharge machining method furthermore have the following advantages:

verifying the wear of the electrode at least once during the machining process and, advantageously, doing this verification several times prevents the use of a defective electrode for machining a part.

activating the sharpening of the tip of the electrode as a function of the determined wear of this tip enables the re-sharpening of this tip only when necessary, permitting the passage to the machining configuration only if the shape of the tip is within a predetermined template prevents the machining of a part with a defective electrode.

BRIEF DESCRIPTION OF THE DRAWINGS

The invention will be understood more clearly from the following description, given purely by way of a non-exhaustive example and made with reference to the appended drawings, of which.

DETAILED DESCRIPTION

In these figures, the same references are used to designate the same elements.

Here below in this description, the characteristics and functions well known to those skilled in the art are not described in detail.

Figure 1:
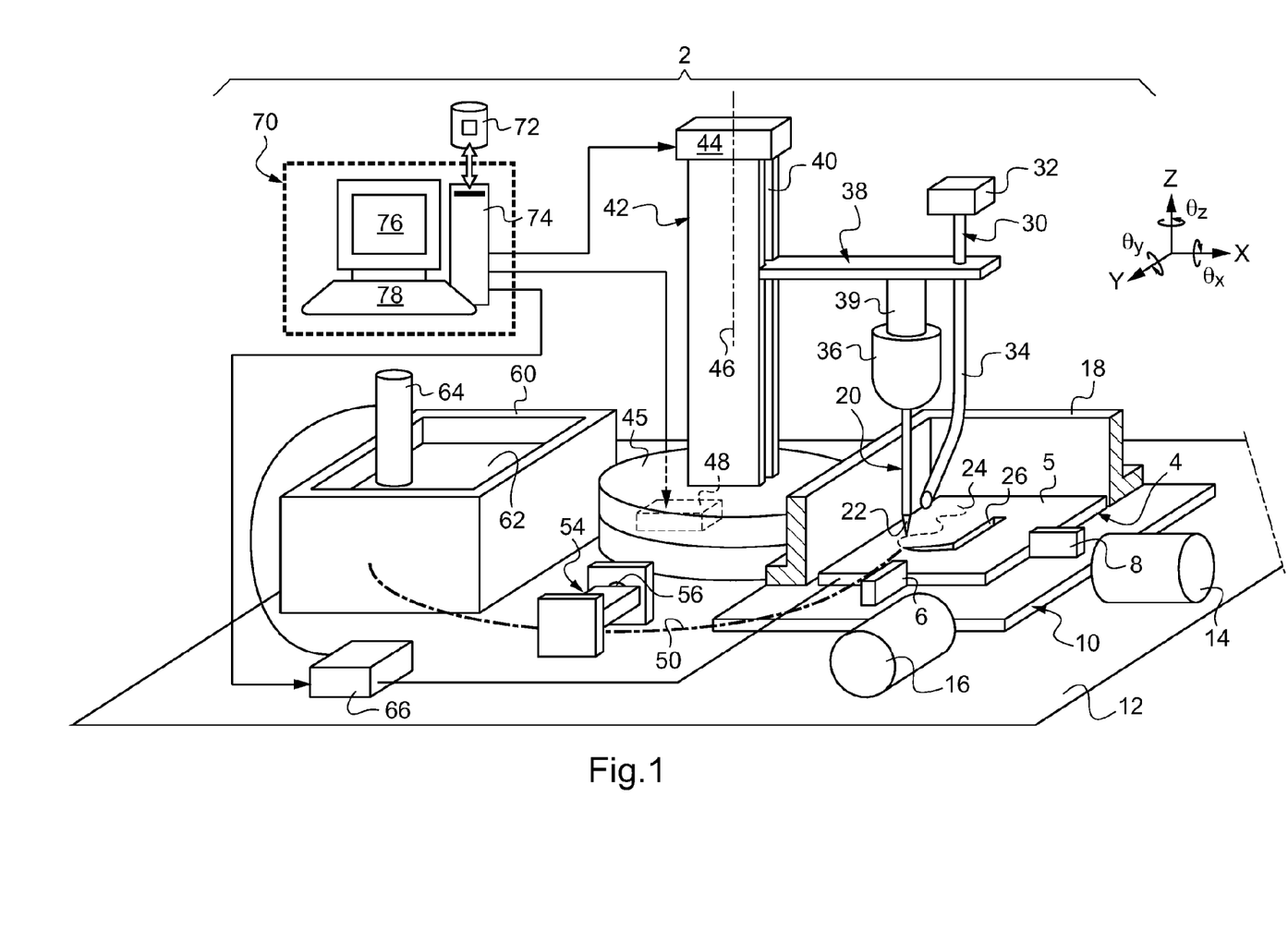
FIG. 1 is a schematic illustration in perspective of a machine for micro-electrical discharge machining.

FIG. 1 shows a machine 2 for the micro-electrical discharge machining of a part 4. This machine 2 is configurable. It can pass from a machining configuration to a sharpening configuration and vice versa. In the machining configuration, the machine can be used to machine the part 4. In the sharpening configuration, the machine 2 can be used to sharpen an etching electrode. In this embodiment, to pass from the machining configuration to the sharpening configuration, an etching electrode can be transported from a machining station to a sharpening station. In FIG. 1, the machine is shown in its machining configuration.

Here, the part 4 is a parallelepiped substrate made out of a semi-conductive or conductive material. For example, the semi-conductive material may be silicon or indium phosphide (InP) or the like. The conductive material may be steel, silicon carbide, titanium or the like.

The part 4 has a horizontal upper face 5 to be machined.

The part 4 is attached without any degree of freedom to a mobile substrate-holder 10. For example, the part 4 is wedged between stops 6 and 8 which hold it on the substrate-holder 10.

The substrate-holder 10 can be shifted horizontally relatively to a horizontal 20 worktop 12. To this end, the machine 2 has translational motion motors, for example piezoelectric actuators 14 and 16 capable of shifting the substrate-holder 10 respectively in two directions X and Y, which are horizontal and perpendicular directions. These actuators 14 and 16 are controllable. Here, the piezoelectrical actuators 14 and 16 have a resolution of less than or equal to 3 nm. They have a position sensor to control the absolute position of the substrate-holder 10 to within 6 nm.

To simplify the description, our main example will be that of piezoelectric actuators based on piezoelectric ceramic stacks with or without mechanical amplification. These piezoelectric actuators are described for example in the technical documentation of the manufacturer Physik Instruments (http://www.physikinstrumente.com/).

The part 4 is plunged into a bath 19 (FIG. 9) of dielectric fluid contained in a recipient 18. The vertical walls of the recipient 18 surround the part 4 so that the face 5 is bathed in the bath 19. In FIG. 1, for the part 4 to be visible, only the vertical walls of the recipient 18 situated behind the part 4 have been shown.

The dielectric fluid contained in the recipient 18 is an insulating fluid, i.e. its resistivity must be great. "Great resistivity" designates resistivity of over 0.1 MΩ.cm and preferably greater than 1 MΩ.cm. For example, the dielectric fluid here is deionized water with a resistivity of over 1 MΩ.cm as described in the following article:

Do Kwan Chung, Bo Hyun Kim and Chong Nam Chu, "Micro-electrical Discharge Milling using Deionized Water as a Dielectric Fluid", *Journal of Micromechanics and Microengineering*, vol 17 (2007) 867-874.

Preferably, the electrical resistivity of the dielectric fluid will be as great as possible. Indeed, the greater the electrical resistivity, the smaller the gap between an etching electrode and the face 5 and the more precise the machining.

The machine 2 has an etching electrode 20. This electrode 20 has a tip 22 on its free-end side.

When the machine 2 is in its machining configuration as shown in FIG. 1, the end of the tip 22 is separated from the upper face of the part 4 by a gap with a width L. This gap should be wide enough to electrically insulate the tip 22 of the face 5. This gap should also be small enough so that when a different of potential is applied between the electrode 20 and the part 4, an electrical arc can arise in this gap. The electrode 20 is used here to carry out three-dimensional machining by electrical discharge machining in the face 5. To this end, the electrode 20 follows a machining path represented on the face 5 by a line of dashes 24.

Figure 9:
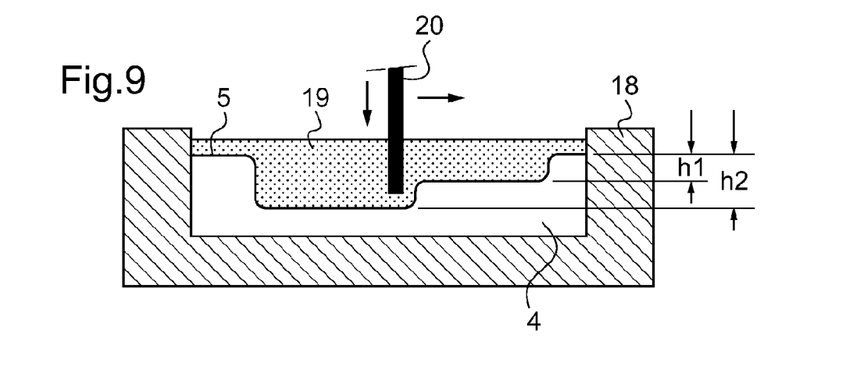
FIG. 9 is a schematic illustration of a three-dimensional machining carried out by means of the machine of FIG. 1.

FIG. 1 also shows a groove 26 already etched in the face 5 by means of the electrode 20. This groove may have continuous or discontinuous variations in height. FIG. 9 shows continuous variations in height. The path may also have discontinuous variations, for example a vertical hole, possibly opening out on the other side of the part, which could be added after the machining of the groove 26.

The tip 22 has a high shape factor, i.e. a factor of more than 10. The term "shape factor" herein designates the ratio between the length of the tip 22 and its width in the vicinity of its free end. The length is measured starting from the distal end 25 of the tip 22 in going towards the opposite end. This length is measured by allowing a variation of 10% in the diameter of the tip. In general, this shape factor ranges from 10 to 100. A high shape factor of the tip also enables the part 4 to be etched with patterns having a high shape factor. The entire length included within the criterion of variation of 10% could be used for the machining.

Here, the electrode 20 is designed to be capable of etching grooves in the part 4, the cross-thickness of which ranges from 10 nm and 10 μm, typically between 100 nm and 1 μm. The width of the smallest groove to be etched determines the diameter of the tip 22. Indeed, this diameter must be smaller than the cross-width of the smallest groove to be etched.

Here, the part of the electrode 20 opposite the tip is generally cylindrical. For example, the diameter of this part ranges between 100 and 500 μm, typically 250 μm so that the entire tip has sufficient mechanical worthiness. It is quite clear that the diameter of the electrode diminishes when moving from this part towards the sharpened part, with a transition zone that will be used neither for the sharpening nor for the machining. For example, the total length of the electrode 20 is 1 cm.

Ideally, the end of the tip 22 has only a few atoms of thickness. To this end, the method described in FIGS. 3 to 8 is used. For greater information on this sharpening method, reference may be made to the following document which belongs to a remote technical field, i.e. that of atomic force microscopes or scanning tunnel microscopes:

J. P. Ibe, J. P. P. Bey, S. L. Brandow, R. A. Brizzolara, N. A. Burnham, D. P., DiLella, K. P. Lee, C. R. K. Marrian, and R. J. Colton, "On the electrochemical etching of tips for scanning tunneling microscopy," *Journal of Vacuum Science & Technology A: Vacuum, Surfaces, and Films*, vol. 8, pp. 3570-3575, 1990.

The electrode 20 is for example made out of platinum-iridium (PtIr) or tungsten (W).

Each time that an electrical arc occurs between the tip 22 and the face 5, small particles of material are liberated from the part 4. During the machining process, particles of matter can remain in the gap. Now, these particles are made out of the same material as the part 4, i.e. a semi-conductive or conductive material. They can therefore locally modify the conductivity of the dielectric fluid between the tip 22 and the face 5.

To reduce this phenomenon, it is necessary to renew the dielectric fluid. To this end, the machine 2 has an apparatus 30 for ejecting dielectric fluid in the vicinity of the gap. This ejection device is used to discharge the semi-conductive or conductive particles present in this gap. This ejection device 30 therefore enables the restoration, at least in part, of the low conductivity of the dielectric fluid present in this gap. For example, to put it very broadly, the ejection device 30 may be formed by a controllable pump 32 and a tube 34 capable of ejecting the dielectric fluid pumped by the pump 32 towards the gap.

The end of the electrode 20 opposite the tip 22 is kept vertical and without any degree of freedom in a mandrel 36. The mandrel 36 is fixedly joined to a plate 38. The plate 38 can be shifted solely in a direction Z vertical and perpendicular to the X and Y axes. To this end, for example, one end of the plate 38 is mounted so as to be sliding in a vertical slideway 40 made in a vertical structural section 42.

A controllable actuator 44, fixedly joined to the structural section 42, is used to shift the plate 38 from top to bottom. For example, the actuator 44 is a piezoelectric actuator whose resolution is smaller than or equal to 3 nm.

Actuators 39 are also used to adjust the tilt and orientation of the electrode 20 by rotation $\theta_x$, $\theta_y$, $\theta_z$ respectively about axes X, Y and Z of the XYZ referential system. For example, these actuators are housed between the plate 38 and the mandrel 36.

To make the machine 2 go from its machining configuration to its sharpening configuration, it has a mechanism for conveying the electrode 20 from the machining station to the sharpening station without its being necessary to dismount this electrode. Furthermore, here, this mechanism also enables the electrode to be carried into a metrology unit.

It is the machining station that has been described up to now. The sharpening and metrology units are described here below.

The mechanism used to modify the configuration of the machine 2 includes a base 45 mounted rotationally about a vertical axis 46 and fixedly joined to the worktop 12. The structural section 42 is fixed without any degree of freedom to the base 45. Furthermore, the rotation of the base 45 about the axis 46 is herein commanded by a controllable actuator 48.

Thus, when the base 45 pivots about the axis 46, the electrode 20 describes a horizontal arc of a circle 50. The arc of the circle 50 is schematically shown in the worktop 12.

Here, when the electrode 20 shifts along the arc 50 in going from right to left, the electrode 20 first of all encounters the metrology station and then the sharpening station.

The metrology station has been shown between the machining station and the sharpening station only to simplify the illustration of FIG. 1. Advantageously, this metrology station is situated above the machining station so that the passage from the machining station to the metrology station and vice versa is done solely by means of the actuator 44.

The metrology station includes sensors of position, orientation and shape of the tip 22. The term "shape sensor" herein designates a sensor capable of measuring at least one physical quantity representing a geometrical characteristic of the tip used to determine the wear on this tip. Advantageously, the shape sensor could also measure the diameter of the tip 22, its shape factor and the height of the transition zone. The orientation sensor is used to determine the tilt of the electrode relatively to 25 the axes of the XYZ referential system of the part to be machined and relatively to the free surface of the electrolyte. The position sensor is used to localize the position of the most distal end of the tip 22 in the XYZ referential system.

Here, these three sensors are made with a single camera 54 with very high resolution. The term "very high resolution" herein designates a camera for which the 30 pixels have a size of less than 0.5 μm and preferably less than 0.3 μm. This camera 54 has an objective 56 positioned in the vicinity of the arc 50 so that it can film the tip 22 when the electrode 20 is inside the metrology station. The position of this camera in a XYZ referential system fixedly joined to the worktop 12 is fixed and known. Thus, the coordinates of each pixel of an image filmed by the camera 54 can be expressed in the XYZ referential system. The working of this camera 54 is described in greater detail with reference to FIG. 2.

The sharpening station enables an electrode with a diameter of 10 nm to 10 μm, typically 100 nm to 1 μm, to be prepared speedily, i.e. in less than 30 minutes, and automatically and at low cost.

To this end, the sharpening station comprises:
a recipient 60 containing an electrolyte bath 62, and
an electrode 64 bathing in the bath 62.
For example, this bath 62 is a saltwater (NaCl) bath.
The machine 2 also has a power source 66 that is entirely controllable and common to the machining and sharpening stations. For example, this power supply source 66 is capable of behaving:

in the sharpening configuration, as a DC or non-DC current generator in an adjustable voltage range to effect the circulation of an electrical current between the electrodes 20 and 64 when these electrodes are dipped in the bath 62, and in the machining configuration, as a DC or non-DC voltage generator in an adjustable range of current, to produce a difference in potentials that is sufficient to activate the appearance of an electrical arc between the tip 22 and the face 5 when the electrode 20 is dipped in the bath 19.

To this end, the electrodes 20 and 64 and the part 4 are electrically connected to this power supply source 66. To simplify FIG. 1, the electrical connection between the electrode 20 and the power supply source 66 has been omitted.

The power supply source 66 is also capable of measuring the difference in potential and the intensity of the current between the electrode 20 and the part 4 and, alternately, between the electrodes 20 and 64.

Finally, the machine 2 has a control unit 70 to command the actuators 14, 16, 19, 39, 44 and 48. This unit 70 is also capable of commanding the source 66 and acquiring the information measured by the camera 54. To simplify FIG. 1, the connections between the units 70 and the different controlled elements have not all been shown.

The unit 70 is made by means of a programmable electronic computer capable of executing instructions recorded on an information-recording medium. For example, to this end, the unit 70 is connected to a memory 72 containing the different instructions needed for executing the method of FIG. 2. Furthermore, here the memory 72 contains a file storing the predetermined path of the electrode 20 to obtain the desired three-dimensional machining of the part 4.

For example, the electronic computer is herein a computer equipped with a central processing unit 74 and a man/machine interface formed by a screen 76 and a keyboard 78.

Figure 2:
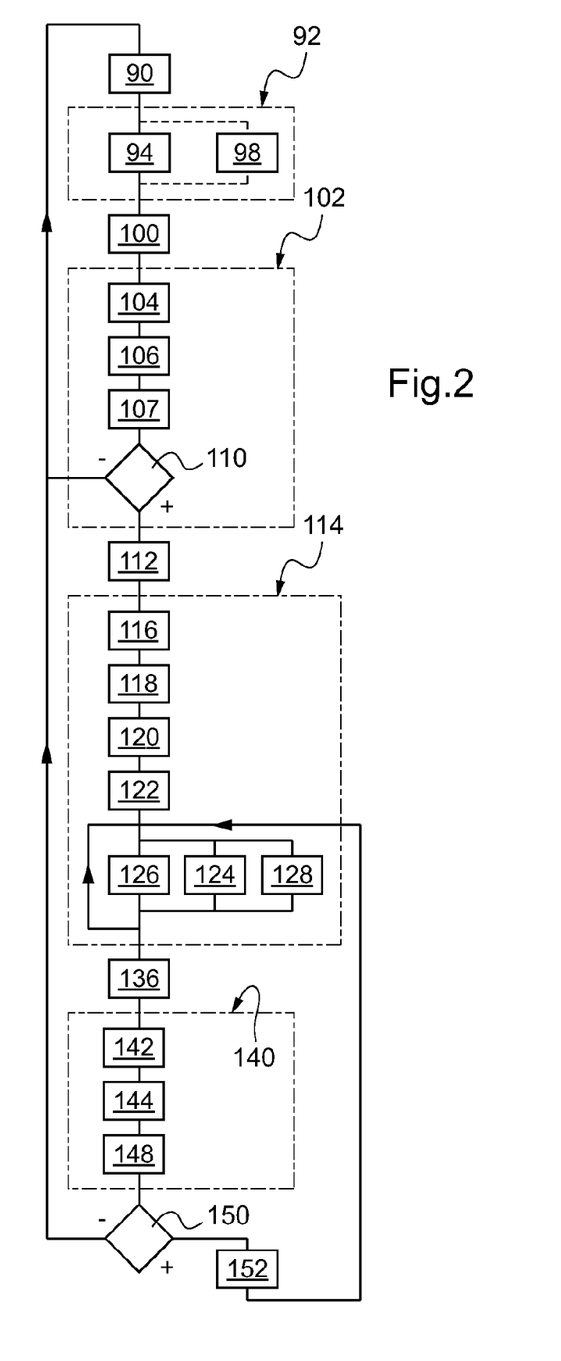
FIG. 2 is a flowchart of a method of micro-electrical discharge machining by means of the machine of FIG. 1, FIGS. 3 to 8 are schematic illustrations of the different stages in the sharpening of an etching electrode of the machine of FIG. 1.
Figure 3:
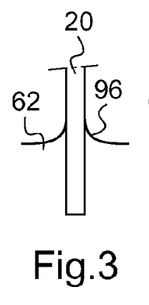
Figure 4:
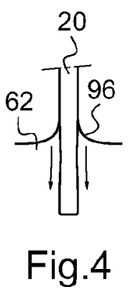
Figure 5:
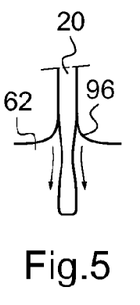
Figure 6:
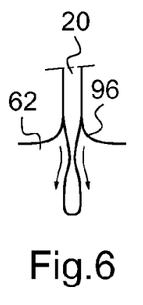
Figure 7:
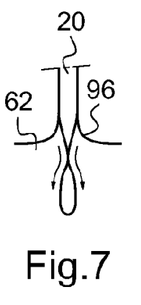

The working of the machine shall now be described with reference to the method represented in FIG. 2.

We take D to be the initial length of the electrode with an initial diameter φ. For example D=1 cm and φ=250 μm. Initially, the machine 2 is brought to its sharpening configuration. For example, in a step 90, the unit 70 commands the actuators 44 and 48 to convey the electrode 20 up to the sharpening station. Then, these actuators are commanded to make the free end of the electrode 20 dip into the bath 62 so that a first segment with a height δ of the electrode is in contact with the electrolyte. The segment with a height δ corresponds to the part of the electrode which will cover the future tip, the transition zone of the electrode leading to the diameter δ and a margin of safety. For example, for a future tip diameter of 1 μm, the height δ is of the order of 50 to 100 μm. When the free end of the electrode 20 is dipped in the bath 62, the machine 2 is considered to be in its sharpening configuration.

Once the machine 2 is in the sharpening configuration, it performs a step 92 for sharpening the electrode 20. Here below, we shall describe the sharpening method known as the "drop off" method as reported especially in:

A. J. Melmed, "The art and science and other aspects of making sharp tips," J. Vac. Sci. Technol. B, vol. 9, pp. 601-608, 1991.

Thus, for example, during an operation 94, the unit 70 commands the power supply source 66 to apply a current between the electrode 64 and the electrode 20. Thus, a thinning down of the electrode 20 occurs preferably at the level of a meniscus 96 (see FIGS. 3 to 8) formed by the bath 62 around the electrode 20.

Figure 8:
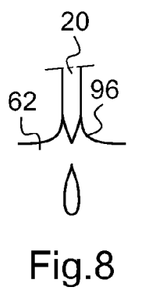

Various successive stages of thinning down the segment with a height δ during the operation 94 are shown in FIGS. 3 to 8. The electrochemical machining due to the circulation of current between the electrodes 20 and 64 sharpens the electrode 20 more swiftly at the meniscus 96 than elsewhere. Thus, the electrochemical machining gradually eats into the electrode 20 at this meniscus 96 until the most distal end of the segment with a height δ gets detached from its main part (FIG. 8). After this detachment, the lower end of the electrode 20 is shaped to form a tip. This tip is very thin and may have a width of only a few atoms at its distal end. The tip 22 is thus made.

If necessary, along with the operation 94, during an operation 98, the actuator 44 is commanded so as to gradually shift the electrode 20 upwards. This operation 98 gives a more elongated tip 22. Further details on the way to command the actuator 94 to elongate the tip 22 are for example given in the following article:

S. H. Choi S. H. Ryu D. K. Choi C. N. Chu, <<Fabrication of WC micro-shaft by using electromechanical etching>>, *Int. J. Adv. Manuf. Technol* (2007), pages 682-687.

Once the sharpening step 92 has been completed, at a step 100, the actuators 44 and 48 are commanded to move the tip 22 up to the metrology station.

When the tip 22 is at the metrology station, in a step 102, the shape, position and tilt of this tip 22 are measured. For example, during an operation 104, the actuators 44 and 48 are commanded to place the tip 22 so as to be exactly facing the objective 56. Then during the operation 104, the camera films the tip 22, in making the tip move if necessary, and transmits the filmed images to the unit 70. Each image is a measurement of the shape, position and orientation of the tip 22.

Then, during an operation 106, the unit 70 optionally corrects the spatial orientation of the electrode in commanding the actuators 39.

During an operation 107, it determines the spatial relationship linking the position of the most distal end of the tip 22 to the position of the mandrel 36. For example, should the electrode 20 be perfectly vertical, this spatial relationship can be reduced to a length $l_0$ between the reference point on the mandrel 20 and the most distal end of the tip 22. During the operation 107, this length is very precisely measured. During the operation 107, the received images are also processed to determine the contour of the tip 22. The position of the reference point on the mandrel in the XYZ referential system is also taken. The position of the reference point is obtained for example from the state of the actuators 44 and 48.

Then, during an operation 110, the unit 70 compares the determined contour of the tip 22 with one or more predetermined templates. If the determined contour is outside the predetermined templates, then the method returns to the step 90. For, this means that a defect in sharpening the electrode 20 has occurred during the step 92 so much so that this electrode is incapable of accurately machining the part 4. In this case, the electrode is plunged for example into an additional segment of height δ in the electrolyte. Thus, D/δ operations of re-sharpening operations can be performed without the machine operator having to manipulate the electrode.

If the contour of the electrode corresponds to the template, then the method is continued with a step 112 for commanding the actuators 44 and 48 to make the machine 2 go into a machining configuration. In the machining configuration, the tip 22 gets dipped in the bath 19 of dielectric fluid of the machining station.

Once the machine is in this machining configuration, a machining step 114 starts.

For example, during an operation 116, the actuators 14, 16, 44 and 48 are commanded to position the tip 22 above the starting point of the machining path of the part 4.

Then, during an operation 118, a potential difference is applied between the electrode 20 and the piece 44. Preferably, the electrode 20 is grounded and a positive potential is applied to the part 4. This potential difference can be obtained directly with a generator driven by transistors (with a finite output resistance, advantageously adjusted so as to limit and control the intensity). It can also be done indirectly by means of a capacitor in a device known as a relaxation generator. Combined devices are also possible. Typically the difference in working potential is experimentally adjusted between 0.1 and 200 V, especially as a function of the nature of the electrode, the diameter of the tip, its exact shape (radius of curvature), the value of the gap, nature of the dielectric, its conductivity if it varies during the machining and the nature of the part to be machined (physical nature, thermal conductivity, calorific capacity, electrical conductivity etc). For example, a difference in potential of 10 V makes it possible to machine silicon with a tungsten tip having a diameter of 1 μm (the dielectric is de-ionized water). To machine stainless steel with the same tip, it is advantageous to apply a voltage of 30 to 100 V.

Once the electrode 20 has been biased relatively to the part 4, in an operation 120, the actuator 44 is commanded to gradually bring the tip 22 closer to the face 5. As and when the tip 22 approaches the face 5, electrical arcs occur. The electrical characteristics of these electrical arcs are monitored to detect the first efficacious electrical arc to machine the face 5 of the part 4.

An electrical arc is deemed to be efficacious when it enables the etching of the part in the vicinity of the gap. There are various means of speedily determining whether an electrical arc is efficacious (advantageously during operation so as not to interrupt the method and so as to be able to stabilize the machining). For example, when measuring the gap current, in the case of an electrical power supply driven by transistors or again when tracking the progress of the potential difference during the descent of the electrode in the case of a power supply based on the charge of a capacitor. In the latter case, any sudden variation in the potential difference often corresponds to a forceful transfer of energy leading to erosion. Other quantities can be used to qualify the electrical arcs (radio-electrical frequencies generated during the arc, light energy etc).

To put it explicitly, situations other than non-erosive discharges may correspond to a mechanical contact leading to a short circuit (which must imperatively be detected to prevent deterioration of the electrode tip), to an open circuit corresponding to an electrode that is far too distant from the part or again to an electrical leak in the gap that prevents the machining.

Be that as it may, when the first efficacious electrical arc is detected, the height $z_1$ of the most distal end of the tip 22 is recorded by the computer during an operation 122, for example by noting the position of the electrode by means of a position sensor integrated into the actuator 44. The height $z_1$ then serves as the point of origin for the vertical shifts of the electrode 20.

Then, in an operation 124, the machining proper of the part 4 starts. It is then necessary to:
 continue to push in the electrode vertically, especially to compensate for the increase in the gap due to the erosion of the part and possibly the erosion of the electrode,
 shift the electrode laterally and/or vertically to machine the part in doing this while at the same time applying an ad hoc difference in potential.

For example, while applying a potential difference, the part 4 is shifted in the directions X or Y during an operation 124 so that the tip 22 follows the predetermined machining path. Simultaneously, during an operation 126, the electrode 20 is shifted in the direction Z to machine the part to the desired depth. The machining depth is herein determined relatively to the position $z_1$ taken during the operation 122.

To obtain accurate machining, it is necessary to adapt the rate of creation of discharges, the rate of renewal of the dielectric, the shifting speeds and the speed of penetration of the electrode and therefore especially the variation of the gap. To this end, the invention plays on the cycle for controlling the potential difference, especially the duration during which the potential difference is applied and the duration during which the system is at rest. This duration is often used to restore the dielectric conditions during an operation 128. In this operation, the original dielectric properties of the dielectric fluid present in the gap are restored. Indeed, these dielectric properties deteriorate as and when the machining takes place given that, after each electrical arc, conductive or semi-conductive particles are released in the gap and therefore modify the electrical conductivity between the electrode 20 and the part 4. Advantageously, to restore the original dielectric conditions, the electrode 20 is made to vibrate from top to bottom with an amplitude of some tens to some hundreds of nanometers. At the same time, advantageously, the part 4 is also made to vibrate. These vibrations of the part 4 are obtained by shifting it in a horizontal plane. Finally and also in parallel, a stream of dielectric fluid is ejected into the gap by means of the tube 34 to clean the conductive and semi-conductive particles that may be present in this gap.

Regularly, a step 136 is carried out to command the actuators 44 and 48 to bring the electrode 20 to the metrology station. Then, in a step 140, the wear of the tip 22 is determined. For example, in an operation 142, the shape of the tip 22 is again measured by means of the camera 54. The images obtained are transmitted to the unit 70.

During an operation 144, the unit 70 then determines the new spatial relationship which links the position of the most distal end of the tip 22 and the position of the mandrel 36. For example, the operation 144 is identical to the operation 104. The length measured at the end of the operation 144 is denoted as $l'_0$.

Then, during an operation 148, the wearing out of the tip is given by the following difference Δ:

$$\Delta = l_0 - l'_0$$

Then, in a step 150, the unit 70 makes a check to find out whether or not the determined wear calls for a re-sharpening of the electrode 20. For example, at the step 150, the difference Δ representing the wear of the tip 22 is compared with a predetermined threshold $S_1$. If this threshold $S_1$ is crossed, then the unit 70 automatically activates the modification of the configuration of the machine 2 and the passage to the sharpening configuration. This corresponds to a return to the step 90.

If not, the method returns to the step 114 to machine a new part or a new portion of the face 5 of the part 4. However, before returning to the step 114, in a step 152, the origin of the heights $z_1$ is modified as a function of the difference Δ. For example, a new starting point of the height $z'_1$ defined by the following relationship is taken into account for the vertical displacements of the electrode 20:

$$z'_1 = z_1 - \Delta$$

Thus, the width L of the gap is adjusted as a function of the difference A during 10 the next operation for machining the part 4. This makes it possible to carry out the operation 124 directly without passing through the operations 116 to 122.

It will be noted here that, when the method returns to the step 90, the tip 22 is dipped in the bath 62 on a new height δ just above the former height. Thus, during the re-sharpening operation, the electrochemical etching finally separates the tip 22 from the main part of the electrode 20 revealing an entirely new tip which will be used for the next machining operation.

The machining step 114 stops after the entire path has been travelled.

FIG. 9 shows an example of three-dimensional machining performed by means of the machine 2. In this example, the vertical section of the shape to be machined has two stages, respectively at depths $h_1$ and $h_2$. The depths $h_1$ and $h_2$ are measured in the direction Z relatively to the face 5. To machine the stage at a depth $h_1$, the unit 70 commands the actuator 44 to stop the machining when the tip 22 is situated at the height $z_1-h_1$. Similarly, the step at the depth $h_2$ is obtained by stopping the etching of the face 5 when the electrode 20 is at the height $z_1-h_2$. The height $z'_1$ is used instead of $z_1$ during subsequent machining operations and so long as the wearing out of the tip does not go beyond the threshold $S_1$.

Figure 10:
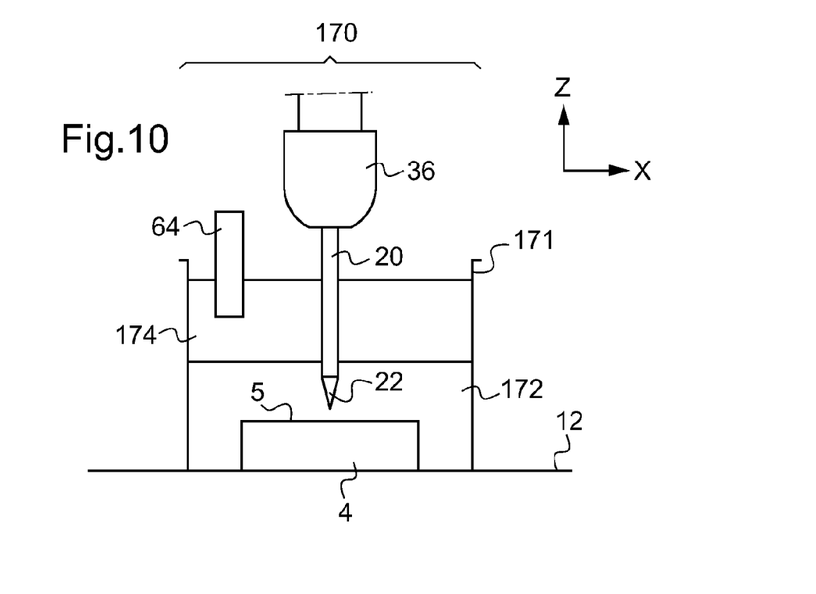
FIG. 10 is a schematic and partial illustration of another embodiment of a machine for micro-electrical discharge machining.

FIG. 10 shows the machine 170 for micro-electrical discharge machining. To simplify FIG. 10, only one portion of the machining and sharpening stations has been shown.

The machine 170 is identical to the machine 2 except that to pass from the machining configuration to the sharpening configuration and vice versa, only one vertical displacement in the direction Z is necessary. To this end, the recipient 18 is replaced by a recipient 171 containing a bath 172 of dielectric fluid as well as an electrolyte bath 174. The mass density of the bath 172 is different from the mass density of the bath 174. Furthermore, the baths 172 and 174 used are non-miscible. For example, in FIG. 10, the density of the bath 172 is greater than the density of the bath 174. In these conditions, the bath 174 is situated above and directly in contact with the bath 172. The part 4 and especially the face 5 of this part 4 bathe in the bath 172.

The mode of operation of the machine 170 is similar to that of the machine 2. More specifically, during the machining of the face 5 with the electrode 20, the tip 22 gets dipped in the bath 172. When the tip 22 needs to be re-sharpened, the mandrel 36 is shifted vertically upwards to bring the tip 22 into the bath 174. The re-sharpening by electrochemical corrosion of the electrode 20 can then take place.

In the machine 170, it is not necessary for the structure 42 to be mounted rotationally on the worktop. The actuator 48 can be omitted. Similarly, the recipient 60 is eliminated.

Many other embodiments are possible. For example, the dielectric fluid may be a gas and not a liquid. The dielectric fluid may also be pure water or water mixed with alcohol. The dielectric fluid may also be any other dielectric used in electrical discharge machining, especially a hydrocarbon.

In the embodiment of FIG. 10, the density of the dielectric fluid can be smaller than that of the electrolyte so that the electrolyte bath is situated beneath the dielectric fluid bath.

The measurement of the shape, position and orientation of the tip 22 can be done by apparatuses independent of one another. These apparatuses may furthermore be partially or totally integrated either into the machining station or into the sharpening station. The measurements can therefore be done without using cameras and metrology stations and the metrology station can be omitted. For example, the shape and position can be measured by mechanical or electrical contact between the tip 22 and a reference face. Advantageously, the position and shape of the tip 22 can also be measured by bringing the tip 22 very gradually closer to a conductive reference face until a tunnel effect occurs. When the tunnel effect occurs, although the tip 22 does not touch the conductive face, a current flows between these two elements. The electrical characteristics and especially the intensity of this current enable the position of the tip relative to the conductive face to be estimated without there being any contact between these two elements. Preferably, in these latter embodiments, the power supply source 66 delivers a very weak, non-erosive and/or non-sharpening electrical signal, enabling the detection of a mechanical contact by electrical detection (or an approach by tunnel effect) between the electrode and the part to be machined and/or the surface of the electrolyte.

An additional camera with a line of sight parallel to the axis Z can also be used to film the tip 22 from beneath. Thus, a longitudinal translational motion of the electrode is expressed by a horizontal shift of the tip if the electrode 20 is tilted. The amplitude of this horizontal shift is proportional to the tilt of the electrode 20.

Other methods for the contactless measuring of the shape of the tip 22 can be implemented such as for example the method described in the following article:

H. S. Lim, S. M. Son, Y. S. Wong, M. Rahman, <<Development and Evaluation of an on-machine optical measurement device>>, *International Journal of Machine Tools and Manufacture* 47 (2007), pages 1 556-1 562.

Other sharpening methods are possible, all based on electrochemical etching (the use of a non-DC power supply source with different levels of electrical signals, ramps, pulses with different cycle ratios etc).

During a new sharpening of the tip 22, it is also possible to dip only the most distal end of the tip so that it is re-sharpened.

The machines described here are not limited to three-dimensional machining. The machines may also be specifically adapted to the performance of simpler machining operations such as making via holes through a plate. In this case, the machine can be simplified. Indeed, determining the wear of the tip is no longer necessary and can be omitted.

There are many other possible embodiments of the mechanism for modifying the configuration of the machining machine. For example, it is possible to shift the baths of dielectric fluid and electrolyte relatively to a fixed electrode in the XYZ reference system. For example, in this embodiment, the recipients 18 and 60 are mounted on a tray rotating about the axis 46 and the structural section 42 is fixed without any degree of freedom in rotation about the working worktop 12. Thus, in this embodiment, it is no longer the electrode 20 that moves but the different stations namely the machining station, the metrology station and the sharpening station. The relative motion of the electrode with respect to the machining and sharpening stations can be linear and not circular.

In another variant, the machine has only one recipient capable of alternately receiving the baths of dielectric fluid and electrolyte fluid. To this end, this recipient is provided with a controllable valve enabling firstly the draining out of the fluid currently present in the recipient and secondly the refilling of the recipient by means of another bath. Thus, in this embodiment, in the machining configuration, the recipient contains a bath of dielectric fluid. In the sharpening configuration, the same recipient contains an electrolyte bath.

Again, in another embodiment, the mechanism enabling the passage from the machining configuration to the sharpening configuration and vice versa consists in ejecting a dielectric gas towards the gap in a sufficiently forceful manner to flush out the electrolyte bath under the effect of the pressure of this gas. When this gas stream is interrupted, the electrolyte bath re-occupies the gap so that a sharpening by electrochemical etching can take place.

Instead of the stacked piezoelectric actuators, other piezoelectric actuators can be envisaged, for example those based on a stick slip type operation. Indeed, these devices whose actuation principle is based on the jerky motion observed during the relative sliding of two objects are a compromise between cost, shifting precision and travel. When the machining resolution sought does not reach 10 nm, especially when the resolution ranges from 100 nm to 1 µm, other variants are possible. For example it is possible, on a same translational axis, to have a piezoelectric actuator and an electrical motor so as to combine the movements with the advantages of obtaining substantial values of travel (typically 10 to 100 nm) with high resolution. It is advantageous to plan for a sensor of movement such as a capacitive sensor or a strain gauge in the case of a purely piezoelectric axis or an optical rule in general.

The renewal of the dielectric fluid between the tip 22 and the face 5 can be obtained by other methods. For example, the following methods can be used alone or in combination:
- making the etching electrode rotate, for example by means of a rotating mandrel,
- making the etching electrode vibrate, for example by means of a piezoelectric actuator,
- total renewal of the fluid in the recipient 18.

By way of an illustration, these methods are described in the following document:

L. Bianchi and E. Rigal, "Usinage par électro-érosion," (Electrical Discharge Machining) in Techniques de l'Ingénieur, vol. B7310. Paris, 1987, pp. 24.

The use of the determined wear to adjust the width of the gap between the tip 22 and the face 5 can be implemented independently of the mechanism for passing from the machining configuration to the sharpening configuration. In particular, such a method of adjusting the width of the gap can be implemented in machines for electrical discharge machining without such a mechanism for modifying the configuration of the machine.

The invention claimed is:

1. An apparatus comprising a machine for machining a part by micro-electrical discharge machining, said machine having a machining configuration, in which a tip of an etching electrode is plunged into a bath of dielectric fluid bathing a face of said part to be machined in order to carry out a machining of said part by electrical discharge machining, said tip of said etching electrode being small enough to enable etching, in said face, of grooves whose cross-width is less than 10 µm, said machine comprising a mechanism that enables a configuration of said machine to be modified, thereby enabling said machine to pass alternately and reversibly from said machining configuration to a sharpening configuration, in which said tip of said etching electrode and another electrode are plunged into an electrolyte bath in order to sharpen said tip of said etching electrode by electrochemical machining, a sensor for obtaining a shape measurement of said tip of said etching electrode, and a control unit configured for comparing said shape measurement with a predetermined template, and if said shape measurement is included in said predetermined template, permitting passage from said sharpening configuration to said machining configuration, and if said shape measurement is not included within said predetermined template, inhibiting passage from said sharpening configuration to said machining configuration.

2. The apparatus of claim 1, wherein said machine further comprises a first recipient containing said dielectric fluid bath, and a second recipient containing said electrolyte bath, and wherein said mechanism that enables said configuration of said machine to be modified is configured to convey said etching electrode between said first recipient and said second recipient, thereby causing said configuration of said machine to pass from said machining configuration to said sharpening configuration and vice versa.

3. The apparatus of claim 1, wherein said machine comprises a first recipient, containing said dielectric fluid bath, and a second recipient, containing said electrolyte fluid bath, and wherein said mechanism that enables a configuration of said machine to be modified is configured to shift said first and second recipients relative to said etching electrode to pass from said machining configuration to said sharpening configuration and vice versa.

4. The apparatus of claim 1, wherein said machine comprises a same recipient that concurrently contains said dielectric fluid bath and said electrolyte fluid bath, wherein said dielectric fluid bath and said electrolyte fluid bath have different mass densities, and wherein said dielectric fluid bath and said electrolyte fluid bath are immiscible, thereby enabling said dielectric fluid bath and said electrolyte fluid bath to be superimposed, one above the other.

5. The apparatus of claim 1, wherein said machine further comprises an actuator, wherein in said machining configuration, said actuator shifts said etching electrode along a direction perpendicular to said face to adjust a width of a gap between said tip of said electrode and said face, and wherein, in said sharpening configuration, said actuator shifts said etching electrode along a direction perpendicular to a surface of said electrolyte fluid bath.

6. The apparatus of claim 1, wherein said machine further comprises a controllable actuator, wherein, in said machining configuration, said actuator shifts said etching electrode along a direction perpendicular to said face, thereby adjusting a width of a gap between said tip of said etching electrode and said face, a sensor for sensing a shape of said tip, and wherein said control unit is further configured for determining an extent of wear of said tip based at least in part on measurements from said shape sensor, and causing said actuator to adjust said width of said gap as a function of said extent of wear.

7. The apparatus of claim 1, wherein said sensor comprises a camera.

8. A method for machining a part by micro-electrical discharge machining using a configurable machine for micro-electrical discharge machining, said method comprising actuating a mechanism for modifying a configuration of said configurable machine, thereby causing said configurable machine to pass alternately and reversibly between a machining configuration and a sharpening configuration, wherein in said machining configuration, a tip of an etching electrode is plunged into a bath of dielectric fluid that bathes a face to be machined in order to perform a machining of said part by electrical discharge machining, said tip of said etching electrode tip being small enough to enable etching of grooves in said face, said grooves having a cross-width that is less than 10 µm, and wherein, in said sharpening configuration, said tip of said etching electrode and another electrode are plunged into an electrolyte bath to carry out a sharpening of said tip of said etching electrode by electrochemical machining, said method comprising, before passing into said machining configuration, measuring a shape of said tip, thereby obtaining a shape measurement, comparing said shape measurement with a predetermined template, if said shape measurement is included in said predetermined template, permitting passage from said sharpening configuration to said machining configuration, and if said shape measurement is not included within said predetermined template, inhibiting passage from said sharpening configuration to said machining configuration.

9. The method of claim 8, wherein said method further comprises determining an extent of wear of said tip from said shape measurement, and activating automatic passage from said machining configuration to said sharpening configuration as soon as said extent of wear crosses a predetermined threshold.

10. The method of claim 8, further comprising determining an extent of wear of said tip based on said shape measurement, and adjusting a width of a gap between said tip and said face to be machined as a function of said extent of wear.

\* \* \* \* \*